US012640757B1

(12) United States Patent
Karabacak et al.

(10) Patent No.: US 12,640,757 B1
(45) Date of Patent: May 26, 2026

(54) METHODS AND APPARATUS FOR DISCONTINUOUS TRANSMISSION (DTX) DETECTION

(71) Applicant: Marvell Asia Pte, Ltd., Singapore (SG)

(72) Inventors: Murat Karabacak, San Jose, CA (US); Satya Phani Tej Nitalla, East Godavari (IN); Chien-Meen Hwang, Saratoga, CA (US); R A Nadisanka P. Rupasinghe, San Ramon, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 321 days.

(21) Appl. No.: 18/102,675

(22) Filed: Jan. 27, 2023

Related U.S. Application Data

(60) Provisional application No. 63/401,116, filed on Aug. 25, 2022.

(51) Int. Cl.
H03M 13/39 (2006.01)
H04W 24/00 (2009.01)
H04W 76/28 (2018.01)
(52) U.S. Cl.
CPC ....... H03M 13/3927 (2013.01); H04W 24/00 (2013.01); H04W 76/28 (2018.02)

(58) Field of Classification Search
CPC .. H03M 13/3927; H04W 24/00; H04W 76/28
See application file for complete search history.

(56) References Cited

U.S. PATENT DOCUMENTS

| | | | | |
|---|---|---|---|---|
| 2011/0044269 | A1* | 2/2011 | Fan | H04L 25/0328 |
| | | | | 370/329 |
| 2013/0343307 | A1* | 12/2013 | Desai | H04W 74/08 |
| | | | | 370/329 |
| 2017/0086222 | A1* | 3/2017 | Sun | H04W 24/10 |
| 2017/0324605 | A1* | 11/2017 | Hong | H04L 27/3494 |
| 2019/0141731 | A1* | 5/2019 | Yoshimoto | H04W 72/12 |
| 2021/0185665 | A1* | 6/2021 | Guzelgoz | H04L 5/0051 |

* cited by examiner

*Primary Examiner* — Jean B Corrielus
(74) *Attorney, Agent, or Firm* — JW Law Group; James M. Wu

(57) ABSTRACT

Methods and apparatus for control bit detection. In an exemplary embodiment, a method includes receiving a descrambled LLR sequence, decoding the descrambled LLR sequence to generate decoded bits, processing the decoded bits to generate a second LLR sequence, correlating the descrambled LLR sequence and the second LLR sequence to generate a correlated output, and detecting a discontinuous transmission (DTX) when the correlated output is less than a threshold level.

22 Claims, 5 Drawing Sheets

DTX
DETECTION CIRCUIT (DDC)

DDC IMPLEMENTATION
IN A RECEIVER

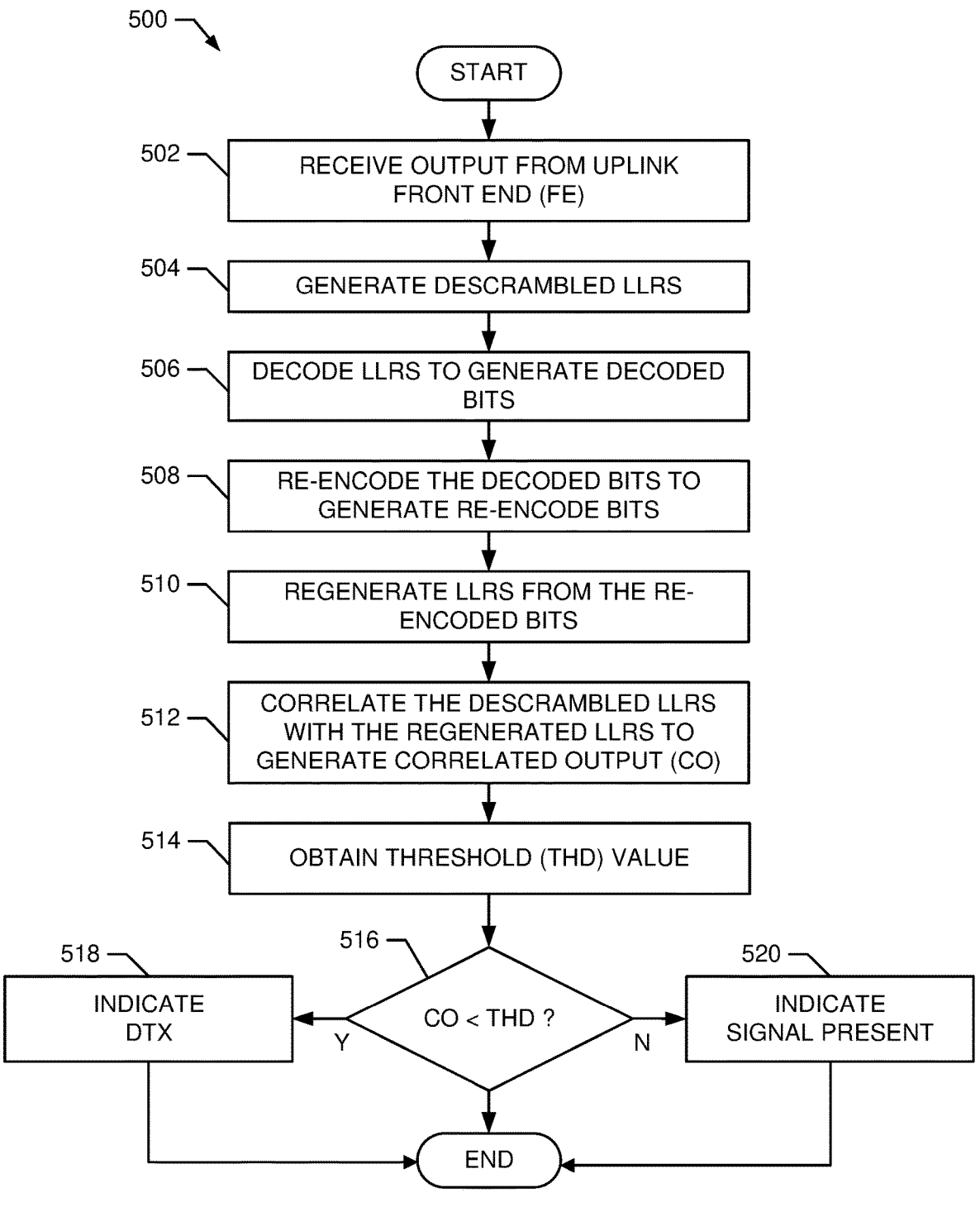

500

START

502 — RECEIVE OUTPUT FROM UPLINK FRONT END (FE)

504 — GENERATE DESCRAMBLED LLRS

506 — DECODE LLRS TO GENERATE DECODED BITS

508 — RE-ENCODE THE DECODED BITS TO GENERATE RE-ENCODE BITS

510 — REGENERATE LLRS FROM THE RE-ENCODED BITS

512 — CORRELATE THE DESCRAMBLED LLRS WITH THE REGENERATED LLRS TO GENERATE CORRELATED OUTPUT (CO)

514 — OBTAIN THRESHOLD (THD) VALUE

516 — CO < THD ?

518 — INDICATE DTX          Y

520 — INDICATE SIGNAL PRESENT          N

END

FIG. 5          METHOD FOR DTX DETECTION

METHODS AND APPARATUS FOR DISCONTINUOUS TRANSMISSION (DTX) DETECTION

PRIORITY

This application claims the benefit of priority under 35 U.S.C 119 (e) to U.S. Provisional Patent Application No. 63/401,116 filed on Aug. 25, 2022 and entitled "DTX Detection by Correlating Decoder Input and Re-encoder Output," which is incorporated by reference herein in its entirety.

FIELD

The exemplary embodiments of the present invention relate to telecommunications networks. More specifically, the exemplary embodiments of the present invention relate to receiving and processing data streams via a wireless communication network.

BACKGROUND

Typically, wireless network performance depends in part on the quality of the transmission channel. For example, if the channel conditions are good, the network may perform with higher speed and capacity than when the channel conditions are poor. To obtain the best network performance, wireless networks may rely on user devices (e.g., user equipment "UE") to report control information back to the network. The control information includes parameters indicating the channel conditions and/or transmission parameters.

One way user devices report control information back to the network is through a physical uplink control channel (PUCCH). The network receives the control information over this channel and uses the received parameters to adjust data transmissions for optimum performance based on the network conditions indicated by the received parameters. For example, the PUCCH channel is used to transport UCI (Uplink Control Information) that includes HARQ feedback, CSI (Channel State Information) and SR (Scheduling Request) information.

During uplink communications, a receiver typically calculates the signal properties at the expected uplink frequency resource to decide if there is transmission energy or a discontinuous transmission (DTX). Therefore, it is desirable to have a detection mechanism that efficiently detects discontinuous transmissions with high probability.

SUMMARY

In various exemplary embodiments, methods and apparatus are provided for DTX detection. In one embodiment, the received signal passes through the whole receive chain, until channel decoding is performed. Then, the decoder output is post-processed to re-encode the decoder's input signal. This re-encoded signal is cross correlated with the actual input signal and the result is compared with a threshold to determine if the signal is exhibiting noise characteristics or characteristics of an actual PUCCH channel signal. The result is an improved DTX detection algorithm, which leads to better network performance. The methods and apparatus are especially well suited to detect DTX events in fifth generation (5G) Format 2 and Format 3 wireless communication networks.

In an exemplary embodiment, a method is provided that includes receiving a descrambled LLR sequence, decoding the descrambled LLR sequence to generate decoded bits, processing the decoded bits to generate a second LLR sequence, correlating the descrambled LLR sequence and the second LLR sequence to generate a correlated output, and detecting a discontinuous transmission (DTX) when the correlated output is less than a threshold level.

In another embodiment, an apparatus is provided that comprises a re-encoder that re-encodes decoded bits to generate re-encoded bits, an LLR regenerator that produces regenerated LLRs from the re-encoded bits, a correlator that correlates descrambled LLRs and the regenerated LLRs to generate a correlated output, and a comparator that compares the correlated output to a threshold value to determine a DTX detection indicator.

Additional features and benefits of the exemplary embodiments of the present invention will become apparent from the detailed description, figures and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

FIG. 5 shows an exemplary method for DTX detection in accordance with the present invention.

DETAILED DESCRIPTION

Figure 1:
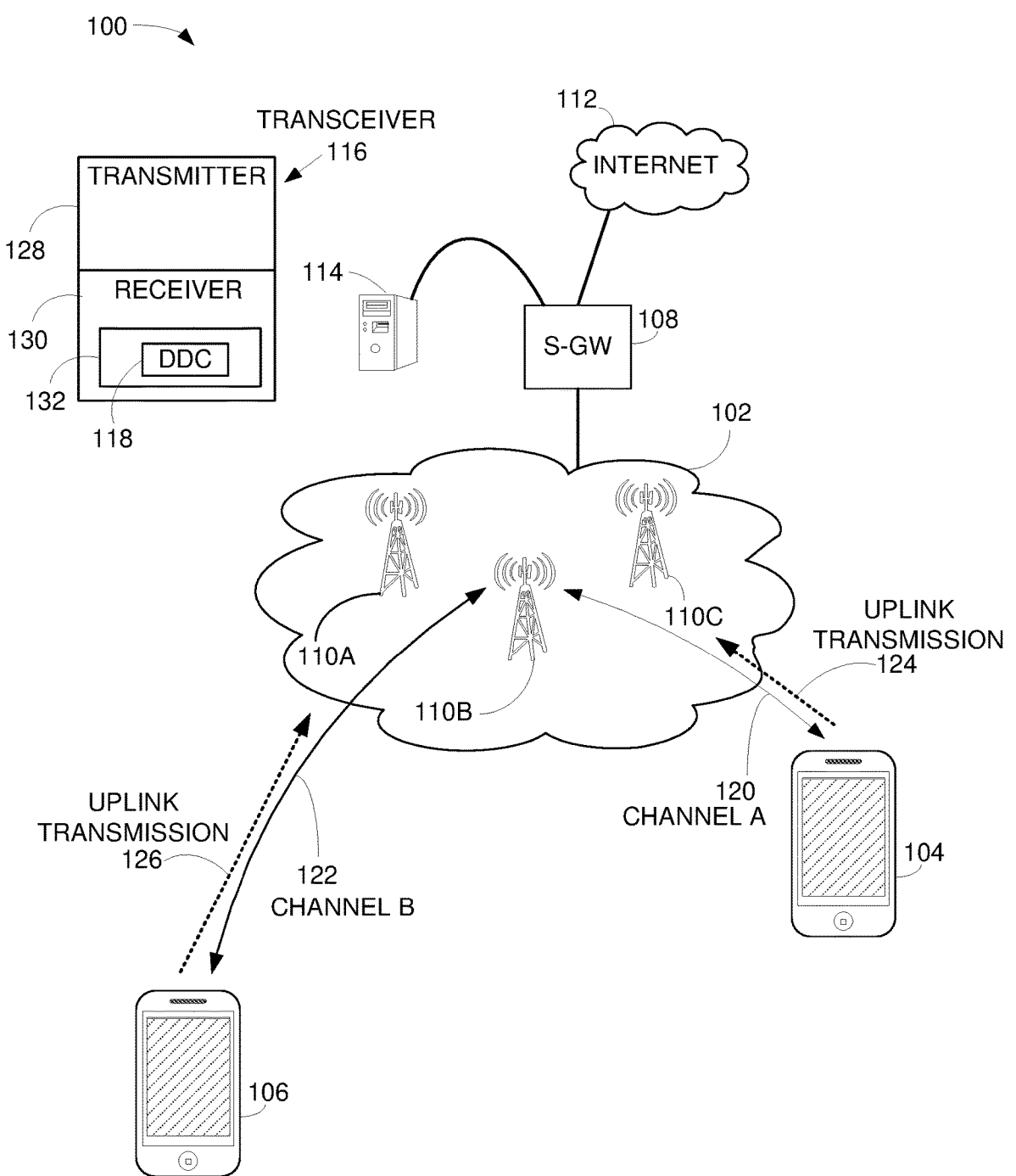
FIG. 1 shows a communication network comprising a receiver having an embodiment of a DTX detection circuit (DDC)

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application and/or business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

FIG. 1 shows a communication network 100 comprising a transceiver 116 having an exemplary embodiment of a DTX detection circuit (DDC) 118 configured to efficiently detect DTX events during communication with user equipment. In an embodiment, the network 100 comprises a fifth generation (5G) wireless communication network.

The communication network 100 includes a server 114 that includes the transceiver 116. The transceiver 116 has a transmitter portion 128 and a receiver portion 130. The server 114 is configured to communicate with a serving gateway (S-GW) 108 that is further configured to communicate with cell site 102 and the Internet 112. The cell site 102 includes radio towers 110A-C and associated base stations (not shown).

User equipment (UE) 104 is in communication with base station 110B using channel A 120 and user equipment 106 is in communication with base station 110B using channel B 122. For example, the UEs can be smartphones, handheld devices, tablet computers or iPad® devices. It should be noted that the underlying concepts of the exemplary embodiments of the present invention would not change if one or more blocks (or devices) were added or removed from the communication network 100. In an exemplary embodiment, the UE 104 transmits uplink information 124 to the server 114 over channel A 120 and the UE 106 transmits uplink information 126 to the server 114 over channel B 122.

The receiver portion 130 includes receiver processing hardware (RPH) 132. In an exemplary embodiment, the RPH 132 includes the DDC 118, which is used to perform efficient detection of DTX events with respect to communications with the UEs (104, 106). In an exemplary embodiment, the DDC 118 is configured to perform DTX detection using a channel decoder correlation process suitable for use with 5G PUCCH Formats 2 and 3 to enhance the overall efficiency of the receiver and the operation of the communication network 100.

Figure 2:
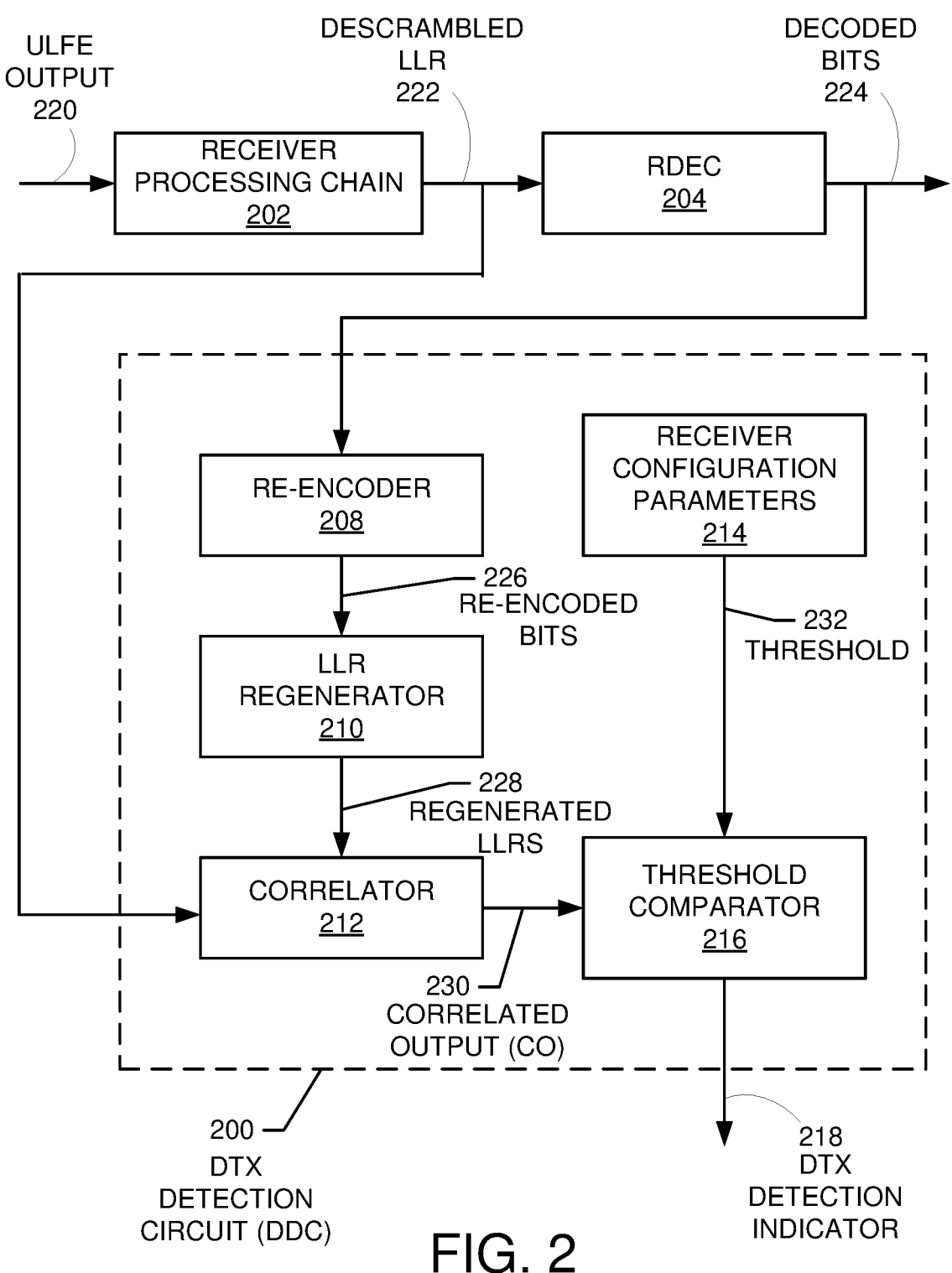
FIG. 2 shows an exemplary embodiment of a DTX detection circuit.

FIG. 2 shows an exemplary embodiment of a DTX detection circuit (DDC) 200. For example, the DDC 200 is suitable for use as the DDC 118 shown in FIG. 1. The DDC 200 operates to receive descrambled LLR control bit values 222 descrambled from a received subframe. The DDC 200 also receives and decoded bits 224 output from a decoder 204 and from these two inputs determines whether or not a DTX event has occurred.

The DDC 200 comprises re-encoder 208, LLR regenerator 210, correlator 212, receiver configuration parameters 214, and threshold comparator 216. An uplink transmission from a UE is received and output 220 from a receiver uplink front end (ULFE). The ULFE output 220 is input to a receiver processing chain 202 that processes the receive signal and generates descrambled LLRs 222. The LLRs 222 are input to a decoder (RDEC) 204 and the correlator 212. The decoder 204 decodes the descrambled LLR 222 to generate decoded bits 224 that are input to the re-encoder 208.

The re-encoder 208 re-encodes the decoded bits 224 to generate re-encoded bits 226. The re-encoded bits 226 are input to the LLR regenerator 210 that operates to produce regenerated LLRs 228. The regenerated LLRs 228 are input to the correlator 212.

The correlator 212 correlates the signals at its two inputs to generate a correlated output (CO) 230 that is input to the threshold comparator 216. Receiver configuration parameters 214 are used to determine a threshold value 232 that is input to the threshold comparator 216. In an embodiment, the threshold value 232 can have different levels based on the configuration of the receiver described by the configuration parameters 214. In an embodiment, the threshold level 232 is determined from at least one of coding length, rate, and antenna size. The threshold comparator 216 determines if the CO 230 is greater than the threshold value 232. When the CO 230 is less than the threshold value 232, the threshold comparator 216 outputs a DTX the detection indicator 218 at a first level to indicate a DTX detection has occurred. When the CO 230 is equal to or greater than the threshold value 232, the threshold comparator 216 outputs the DTX detection indicator 218 at a second level to indicate that a DTX detection has not occurred and to indicate that a transmission signal is present.

Figure 3:
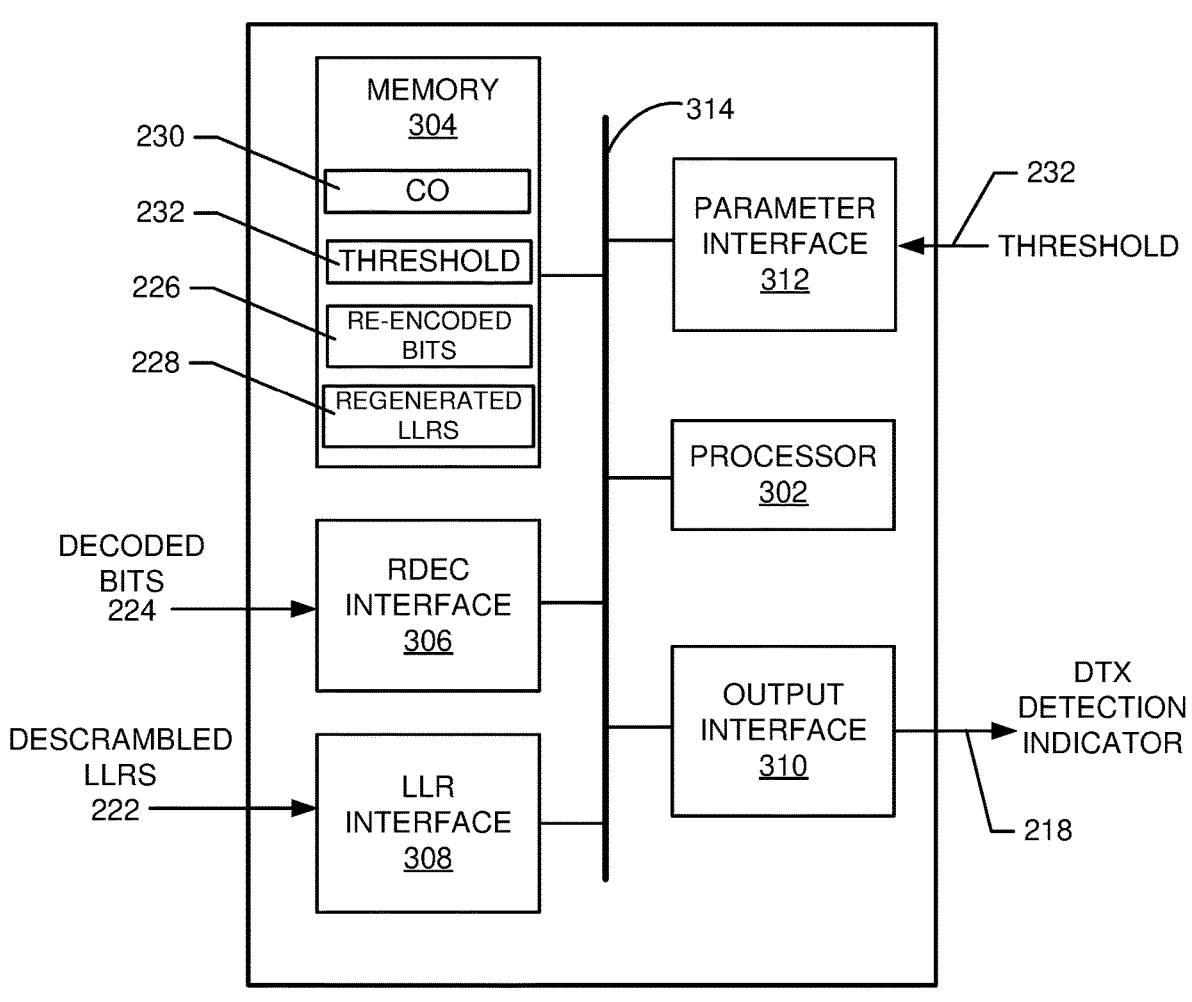
FIG. 3 shows an alternative embodiment of a DTX detection circuit.

FIG. 3 shows an alternative embodiment of a DTX detection circuit 300. For example, the DDC 300 is suitable for use as the DDC 118 shown in FIG. 1. The DDC 300 comprises processor 302, memory 304, RDEC interface 306, LLR interface 308, output interface 310, and parameter interface 312 all coupled to communicate over bus 314.

The processor 302 comprises at least one of a CPU, processor, state machine, programmable logic, memory, hardware, and/or discrete components that perform the functions described herein. The processor 302 is configured to execute programs or algorithms to perform the functions described herein.

The memory 304 comprises any suitable memory, such as RAM, PROM, or other type of memory. In one embodiment, the memory 304 stores threshold information that can be retrieved by the processor 302 during operation.

The RDEC interface 306 comprises at least one of a CPU, processor, state machine, programmable logic, memory, hardware, and/or discrete components that perform the functions described herein. The RDEC interface 306 operates to receive decoded bits 224, for instance, from the RDEC 204 shown in FIG. 2.

The LLR interface 308 comprises at least one of a CPU, processor, state machine, programmable logic, memory, hardware, and/or discrete components that perform the functions described herein. The LLR interface 306 operates to receive descrambled LLRs, for instance, from the receiver processing chain 202 shown in FIG. 2.

The output interface 310 comprises at least one of registers, gates, latches, hardware components, and/or discrete components that output DTX detection results. For example, in an exemplary embodiment, the processor 302 controls the output interface 310 to output the DTX detection indicator 218.

The parameter interface 312 comprises at least one of registers, gates, latches, hardware components, and/or discrete components that output DTX detection results. For example, in an exemplary embodiment, the processor 302 controls the parameters interface 312 to receive a threshold value 232 or other parameters that are then stored in the memory 304.

During operation, the processor 302 controls the LLR interface 308 to receive the descrambled LLRs 222. The processor 302 also controls the RDEC interface 306 to receive the decoded bits 224. The processor 302 is configured to perform a re-encoder function to re-encode the decoded bits 224 to generate re-encoded bits 226 that are stored in the memory 304. The processor 302 is also configured to perform an LLR regeneration function to obtain the re-encoded bits 226 from the memory 304 and regenerate LLRs 228 that are stored back into the memory 304.

The processor 302 is configured to perform a correlation function that correlates the regenerated LRR's 228 with the descrambled LLR's 222 to generate a correlated output 230 that is stored in the memory 304. The processor 302 then performs a comparison function to compare the threshold 232 with the CO 230 to determine the state of the DTX detection indicator 218, which is output from the output interface 310. A more detailed description of the functions performed by the processor 302 is provided below.

Figure 4:
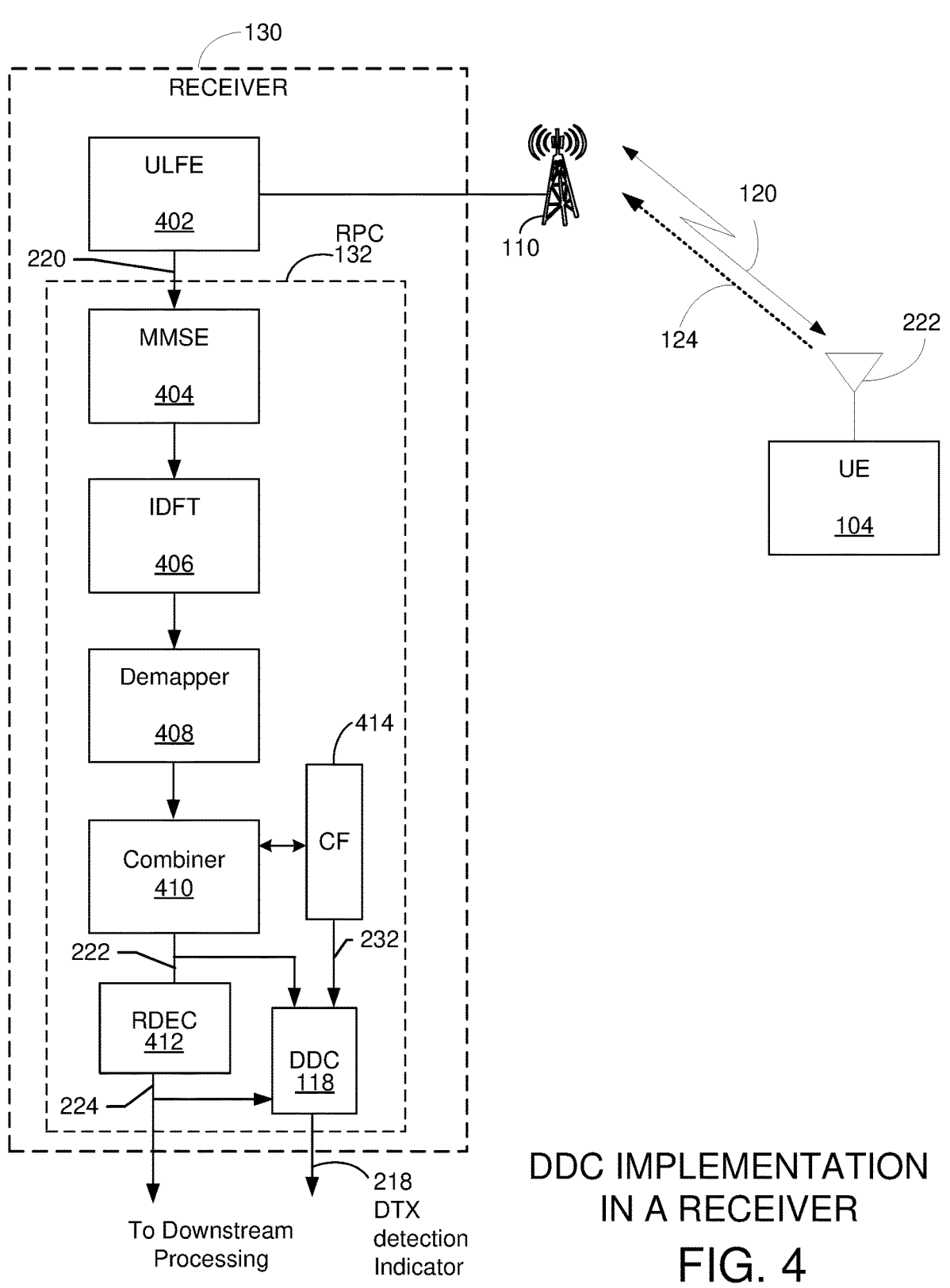
FIG. 4 shows an exemplary receiver chain that includes an embodiment of a DTX detection circuit.

FIG. 4 shows an exemplary receiver that includes an embodiment of a DTX detection circuit 118. For example, the DDC 118 comprises the DDC 200 or DDC 300. An uplink transmission 124 transmitted from the UE 104 and flows over channel A 120 through the communication network 110 to the receiver portion 130 of the transceiver 116. At the receiver portion 130, the uplink transmission is received at an uplink front end (ULFE) 212. After receiving the uplink transmission, the ULFE 212 passes a received signal output 220 to the receiver processing chain (RPC) 132.

The RPC 132, in one exemplary embodiment, includes MMSE 404, IDFT 406, demapper 408, combiner 410, channel decoder 412. In an exemplary embodiment, the RPC 132 also includes configuration parameters (CF) 414 and an embodiment of the DDC 118. The RPC 132 is configured to process transmissions received by the ULFE 212 and the result of such processing is output to a downstream processing system (not shown).

The minimum mean square equalizer (MMSE) 402, in one example, includes an equalizer with serial interference cancellation ("SIC") capability. The MMSE 402 generates estimated values using a function of mean-square-error or equalization of received signals or bit stream(s) during the signal processing phase. MMSE 402 also provides functionalities to equalize multiple streams of data received simultaneously over the air. For instance, the number of bit streams such as one (1) to eight (8) streams can arrive simultaneously.

The IDFT 406 converts symbols or samples between frequency domains.

After conversion, the IDFT 406 may store the symbols or samples in a storage matrix (not shown). Depending on the application, the IDFT 406 passes the symbols to the next logic block, which is the demapper 408.

The Demapper 408 operates to demap or ascertain soft bit information associated with received symbol(s) or bit stream(s). For example, demapper 408 employs a soft demapping principle, which is based on computing the log-likelihood ratio (LLR) of a bit that quantifies the level of certainty as to whether it is a logical zero or one. To reduce noise and interference, the demapper 408 is also capable of discarding one or more unused constellation points relating to the frequency of the bit stream from the constellation map.

The combiner 410 provides a combining function that combines LLR bits to form descrambled LLR bit streams 222 to be decoded that flow to the channel decoder 412 and the DDC 118. The channel decoder (RDEC) 412 receives the combiner 410 output and generates decoded bits 224 that flow to a downstream processing system and the DDC 118. The RPH 132 also includes configuration parameters (CF) 414 that provides threshold parameters 232 to the DDC 118. In an embodiment, the DDC 118 processes the inputs it receives to generate the DTX detection indicator 218 as describe by the embodiments herein.

FIG. 5 shows an exemplary method 500 for detecting DTX events in accordance with the present invention. For example, the method 500 is suitable for use with the DDC 118, 200, or 300 shown in FIGS. 1-3.

At block 502, an output from an uplink front end is received. For example, the output 220 from the uplink front end is received by the receiver processing chain 202.

At block 504, descrambled LLRs are generated from the ULFE output. For example, the receiver processing chain 202 generates descrambled LLR's 222.

At block 506, the LLRs are decoded to generate decoded bits. For example, the decoder 204 decodes the descrambled LR 222 to generate decoded bits 224.

At block 508, the decoded bits are re-encoded to generated re-encoded bits. For example, the re-encoder 208 re-encodes the decoded bits to 24 to generate re-encoded bits 226.

At block 510, LLRs are regenerated from the re-encoded bits. For example, the re-encoded bits 226 are input to the LLR regenerator 210, which produces regenerated LLR's 228

At block 512, the descrambled LLRs are correlated with the regenerated LLRs to generate a correlated output. For example, the correlator 212 correlates the regenerated LLR's 228 with the descrambled LLR's 222 to generate the correlated output 230.

At block 514, a threshold value is obtained. For example, the threshold value 232 is obtained from receiver configuration parameters 214.

At block 516, a determination is made as to whether the correlated output is less than the threshold value. For example, the threshold comparator 216 compares the correlated output 230 with the threshold level 232. If the correlated output is less than the threshold level, then method proceeds to block 518. If the correlated output is not less than the threshold level, then the method proceeds to block 520.

At block 518, a DTX indicator is generated to indicate that a DTX event has been detected.

At block 520, a signal present indicator is generated to indicate that a DTX event has not been detected.

Thus, the method 500 operates to efficiently detect DTX events for uplink transmission in accordance with embodiments of the present invention. It should be noted that the operations of method 500 are exemplary and not limiting and that the operations can be added to, deleted, rearranged, or otherwise modified within the scope of the embodiments.

The exemplary aspect of the present invention includes various processing steps as described above. The steps may be embodied in machine or computer executable instructions. The instructions can be used to cause special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

While particular embodiments of the present invention have been shown and described, it will be obvious to those skilled in the art that, based upon the teachings herein, changes and modifications may be made without departing from these exemplary embodiments and their broader aspects. Therefore, the appended claims are intended to encompass within their scope all such changes and modifications as are within the true spirit and scope of these exemplary embodiments of the present invention.

What is claimed is:

1. A method, comprising:
   receiving a descrambled log-likelihood ratio (LLR) sequence;
   decoding the descrambled LLR sequence to generate decoded bits;
   processing the decoded bits to generate a second LLR sequence;
   correlating the descrambled LLR sequence and the second LLR sequence to generate a correlated output; and
   detecting a discontinuous transmission (DTX) when the correlated output is less than a threshold level.

2. The method of claim 1, wherein the operation of processing comprises:
   re-encoding the decoded bits to generate re-encoded bits; and
   regenerating regenerated LLRs from the re-encoded bits.

3. The method of claim 1, further comprising receiving a first descrambled LLR sequence is derived from an uplink transmission received by a receiver processing chain.

4. The method of claim 1, wherein the threshold level is part of configuration parameters for a receiver.

5. The method of claim 4, wherein the threshold level is determined from at least one of coding length, rate, and antenna size.

6. The method of claim 1, further comprising detecting a transmitted signal when the correlated output is not less than the threshold level.

7. The method of claim 1, outputting a DTX detection indicator when the discontinuous transmission is detected.

8. An apparatus, comprising:
   re-encoder that re-encodes decoded bits to generate re-encoded bits;
   a log-likelihood ratio (LLR) regenerator that produces regenerated LLRs from the re-encoded bits;
   a correlator that correlates descrambled LLRs and the regenerated LLRs to generate a correlated output; and
   a comparator that compares the correlated output to a threshold value to determine a discontinuous transmission (DTX) DTX detection indicator.

9. The apparatus of claim 8, further comprising a receiver processing chain configure configured to generate a descrambled LLR sequence derived from an uplink transmission.

10. The apparatus of claim 8, wherein the threshold value is part of configuration parameters for a receiver.

11. The apparatus of claim 8, wherein the threshold value is determined from at least one of coding length, rate, and antenna size.

12. The apparatus of claim 8, wherein the comparator generates the DTX detection indicator when the correlated output is less than the threshold value.

13. The apparatus of claim 8, wherein the comparator detects a transmitted signal when the correlated output is not less than the threshold value.

14. The apparatus of claim 8, wherein the comparator outputs the DTX detection indicator.

15. An apparatus, comprising:
   a decoder interface that receives decoded bits;
   a receiver interface that receives descrambled log-likelihood ratios (LLRs);
   a processor that performs operations of:
      processing the decoded bits to generate a regenerated LLRs;
      correlating the descrambled LLRs and the regenerated LLRs to generate a correlated output; and
      detecting a discontinuous transmission (DTX) when the correlated output is less than a threshold level.

16. The apparatus of claim 15, wherein the operation of processing comprises:
   re-encoding the decoded bits to generate re-encoded bits; and
   regenerating the regenerated LLRs from the re-encoded bits.

17. The apparatus of claim 15, wherein the descrambled LLRs are derived from an uplink transmission received by a receiver processing chain.

18. The apparatus of claim 15, wherein the threshold level is part of configuration parameters for a receiver.

19. The apparatus of claim 15, wherein the threshold level is determined from at least one of coding length, rate, and antenna size.

20. The apparatus of claim 15, further comprising a comparator for detecting a transmitted signal.

21. An apparatus, comprising:
   means for receiving a descrambled log-likelihood ratio (LLR) sequence;
   means for decoding the descrambled LLR sequence to generate decoded bits;
   means for processing the decoded bits to generate a second LLR sequence;
   means for correlating the descrambled LLR sequence and the second LLR sequence to generate a correlated output; and
   means for detecting a discontinuous transmission (DTX) when the correlated output is less than a threshold level.

22. The apparatus of claim 21, wherein the means for processing comprises:
   means for re-encoding the decoded bits to generate re-encoded bits; and
   means for regenerating regenerated LLRs from the re-encoded bits.

* * * * *